United States Patent
Tortorelli

(10) Patent No.: US 11,587,612 B2
(45) Date of Patent: Feb. 21, 2023

(54) NEURAL NETWORK MEMORY WITH AN ARRAY OF VARIABLE RESISTANCE MEMORY CELLS

(71) Applicant: Micron Technology, Inc., Boise, ID (US)

(72) Inventor: Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 846 days.

(21) Appl. No.: 16/502,978

(22) Filed: Jul. 3, 2019

(65) Prior Publication Data

US 2021/0005250 A1    Jan. 7, 2021

(51) Int. Cl.
| | |
|---|---|
| *G11C 11/54* | (2006.01) |
| *G06K 9/62* | (2022.01) |
| *G06N 3/063* | (2006.01) |
| *G11C 11/56* | (2006.01) |
| *G11C 13/00* | (2006.01) |

(52) U.S. Cl.
CPC ............ *G11C 11/54* (2013.01); *G06K 9/6264* (2013.01); *G06N 3/063* (2013.01); *G11C 11/5628* (2013.01); *G11C 11/5678* (2013.01); *G11C 13/003* (2013.01); *G11C 13/0004* (2013.01); *G11C 13/004* (2013.01); *G11C 13/0069* (2013.01); *G11C 2213/77* (2013.01)

(58) Field of Classification Search
None
See application file for complete search history.

(56) References Cited

U.S. PATENT DOCUMENTS

| | | | |
|---|---|---|---|
| 4,876,668 | A | 10/1989 | Thakoor et al. |
| 2016/0358661 | A1 | 12/2016 | Vali et al. |
| 2017/0083811 | A1 | 3/2017 | Cho et al. |
| 2017/0277628 | A1 | 9/2017 | Paul et al. |
| 2018/0330236 | A1 | 11/2018 | Tuo-Hung et al. |
| 2019/0065943 | A1 | 2/2019 | Pierre-Luc et al. |
| 2019/0164600 | A1 | 5/2019 | Castro |

(Continued)

FOREIGN PATENT DOCUMENTS

| | | |
|---|---|---|
| TW | I625681 B | 6/2018 |
| TW | 201911139 A | 3/2019 |

OTHER PUBLICATIONS

Sebastian et al. "Tutorial: Brain-inspired computing using phase-change memory devices" Journal of Applied Physics 124, 111101 pp. 1-15; published: Sep. 18, 2018. (Year: 2018).*

(Continued)

*Primary Examiner* — J. H. Hur
(74) *Attorney, Agent, or Firm* — Brooks, Cameron & Huebsch, PLLC

(57) ABSTRACT

In an example, an apparatus can include an array of variable resistance memory cells and a neural memory controller coupled to the array of variable resistance memory cells and configured to apply a sub-threshold voltage pulse to a variable resistance memory cell of the array to change a threshold voltage of the variable resistance memory cell in an analog fashion from a voltage associated with a reset state to effectuate a first synaptic weight change; and apply additional sub-threshold voltage pulses to the variable resistance memory cell to effectuate each subsequent synaptic weight change.

24 Claims, 6 Drawing Sheets

(56) References Cited

U.S. PATENT DOCUMENTS

| | | |
|---|---|---|
| 2019/0198105 A1 | 6/2019 | Pirovano |
| 2019/0318781 A1* | 10/2019 | La Barbera .............. G11C 7/10 |
| 2020/0005863 A1* | 1/2020 | Grobis ................ H01L 45/1675 |
| 2020/0034686 A1* | 1/2020 | Chiu ................... G11C 11/5678 |

OTHER PUBLICATIONS

Boybat et al. "Neuromorphic computing with multi-memristive synapses" Nature Communicatons 9:2514 pp. 1-12; published: Jun. 28, 2018. (Year: 2018).*

International Search Report and Written Opinion from related International Application No. PCT/US2020/035816, dated Sep. 11, 2020, 12 pages.

Alexander Ororbia, et al., "Investigating Recurrent Neural Network Memory Structures using Neuro-Evolution", arXiv:1902.02390v2[cs. NE], Feb. 8, 2019, 11 pages.

Office Action from related Taiwan Patent Application No. 109120423, dated Nov. 16, 2021, 16 pages.

Ambrogio, et al., "Unsupervised Learning by Spike Timing Dependent Plasticity in Phase Change Memory (PCM) Synapses", vol. 10, Article 56, Mar. 8, 2016, 12 pages.

Ambrogio, et al., "Neuromorphic Learning and Recognition With One-Transistor-One-Resistor Synapses and Bistable Metal Oxide Rram", IEEE Transactions on Electron Devices, vol. 63, No. 4, Apr. 2016, 8 pages.

U.S. Appl. No. 16/001,790, entitled "Weight Storage Using Memory Device", filed Jun. 6, 2018, 58 pages.

\* cited by examiner

660 ↘

```
┌─────────────────────────────────────────────────────────┐
│ APPLYING, BY A NEURAL MEMORY UNIT CONTROLLER            │
│ COUPLED TO AN ARRAY OF VARIABLE RESISTANCE MEMORY CELLS,│─ 692
│ A WEAK SUB-THRESHOLD VOLTAGE PULSE TO                   │
│ A VARIABLE RESISTANCE MEMORY CELL OF THE ARRAY          │
│ IN RESPONSE TO A FIRST WEAK LEARNING EVENT              │
└─────────────────────────────────────────────────────────┘
                            │
┌─────────────────────────────────────────────────────────┐
│ APPLYING, BY THE NEURAL MEMORY UNIT CONTROLLER          │
│ COUPLED TO THE ARRAY OF VARIABLE RESISTANCE MEMORY CELLS,│─ 694
│ A STRONG SUB-THRESHOLD VOLTAGE PULSE TO                 │
│ THE VARIABLE RESISTANCE MEMORY CELL OF THE ARRAY        │
└─────────────────────────────────────────────────────────┘
```

```
┌─────────────────────────────────────────────────────────┐
│ APPLYING, BY A NEURAL MEMORY UNIT CONTROLLER            │
│ COUPLED TO AN ARRAY OF VARIABLE RESISTANCE MEMORY CELLS,│
│ A FIRST QUANTITY OF SUB-THRESHOLD VOLTAGE PULSES        │─ 791
│ TO A VARIABLE RESISTANCE MEMORY CELL OF THE ARRAY       │
│ IN RESPONSE TO A WEAK LEARNING EVENT                    │
└─────────────────────────────────────────────────────────┘
                            │
┌─────────────────────────────────────────────────────────┐
│ APPLYING, BY THE NEURAL MEMORY UNIT CONTROLLER          │
│ COUPLED TO THE ARRAY OF VARIABLE RESISTANCE MEMORY CELLS,│
│ A SECOND QUANTITY OF SUB-THRESHOLD VOLTAGE PULSES       │─ 793
│ TO THE VARIABLE RESISTANCE MEMORY CELL OF THE ARRAY     │
│ IN RESPONSE TO A STRONG LEARNING EVENT                  │
└─────────────────────────────────────────────────────────┘
```

NEURAL NETWORK MEMORY WITH AN ARRAY OF VARIABLE RESISTANCE MEMORY CELLS

TECHNICAL FIELD

The present disclosure relates generally to operating apparatus, such as memories, and, more particularly, to neural network memory.

BACKGROUND

Memory devices may typically be provided as internal, semiconductor, integrated circuits in computers or other electronic devices. There are various types of memory including volatile and non-volatile memory.

Various memory arrays can be organized in a cross-point architecture with memory cells (e.g., two terminal cells) being located at intersections of a first and second signal lines used to access the cells (e.g., at intersections of access lines and sense lines). Some memory cells can be, for example, resistance variable memory cells whose logic state (e.g., stored data value) depends on the programmed resistance of the memory cell. Some variable resistance memory cells, which may be referred to as self-selecting memory cells, comprise a single material which can serve as both a select element and a storage element for the memory cell.

BRIEF DESCRIPTION OF THE DRAWINGS

FIG. 6 illustrates an example method for neural network memory using a memory device in accordance with embodiments of the present disclosure.

FIG. 7 illustrates an example method for neural network memory using a memory device in accordance with embodiments of the present disclosure.

DETAILED DESCRIPTION

Figure 1:
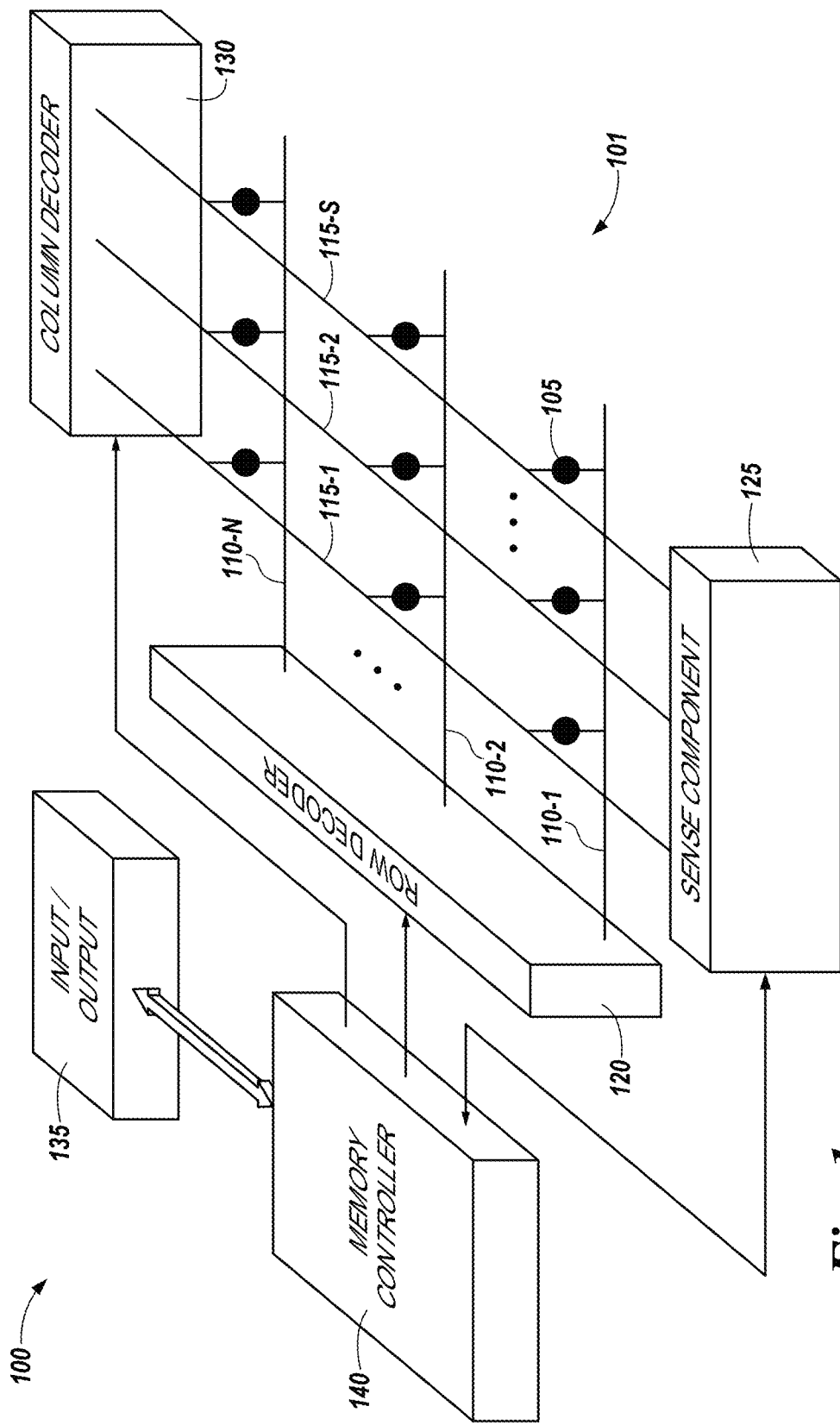
FIG. 1 illustrates an example of an apparatus in the form of a memory array of a memory device in accordance with various embodiments of the present disclosure.

In neural networks a synaptic weight may refer to the strength or amplitude of a connection between two nodes (e.g., a neuron). The nature and content of information transmitted through a neural network may be based in part on the properties of synapses formed between the nodes (e.g., synaptic weight). Memory arrays can be operated as neural network memory (e.g., neuromorphic systems and devices) and can be designed to achieve results that may not be possible with traditional computer architectures. For example, neuromorphic systems may be used to achieve results more commonly associated with biological systems such as learning, vision or visual processing, auditory processing, advanced computing, or other processes, or a combination thereof.

Systems, apparatuses, devices, and methods configured to mimic neuro-biological architectures that may be present in a nervous system and/or to store synaptic weight are described herein. In an example, an apparatus may include an array of variable resistance memory cells and a neural memory unit controller coupled to the array of variable resistance memory cells. The neural memory unit controller can be configured to apply a sub-threshold voltage pulse to a variable resistance memory cell of the array to change a threshold voltage of the variable resistance memory cell in an analog fashion from a voltage associated with a reset state to effectuate a first synaptic weight change; and apply additional sub-threshold voltage pulses to the variable resistance memory cell to effectuate each subsequent synaptic weight change.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "M", "P", "R", "B", "S", and "N", as used herein, particularly with respect to reference numerals in the drawings, indicates that a number of the particular feature so designated can be included with a number of embodiments of the present disclosure. The number may be the same or different between designations.

The figures herein follow a numbering convention in which the first digit or digits correspond to the drawing figure number and the remaining digits identify an element or component in the drawing. Similar elements or components between different figures may be identified by the use of similar digits. For example, 101 may reference element "01" in FIG. 1, and a similar element may be referenced as 201 in FIG. 2.

FIG. 1 illustrates an example of an apparatus in the form of a memory array of a memory device in accordance with various embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. FIG. 1 is an illustrative representation of various components and features of the memory device 100. As such, it should be appreciated that the components and features of the memory device 100 are shown to illustrate functional interrelationships, not their actual physical positions within the memory device 100.

Although some elements included in FIG. 1 are labeled with a numeric indicator, other corresponding elements are not labeled, though they are the same or would be understood to be similar, in an effort to increase the visibility and clarity of the depicted features.

In the illustrative example of FIG. 1, the memory device 100 includes a memory array 101. The memory array 101 includes memory cells 105 that may be programmable to different logic states. In some embodiments, each memory cell 105 may be programmable to two states, denoted as a logic 0 and a logic 1. In some embodiments, a memory cell 105 may be programmable to more than two logic states. A memory cell 105 may, in some embodiments, include a variable resistance memory cell such as a self-selecting memory cell. A self-selecting memory cell is a memory cell comprising a single chalcogenide material to operate as a selection component and a storage component.

As will be described further herein, variable resistance memory cells can be self-selecting memory cells and can be arranged into an array (e.g., a neural memory unit) to mimic neuro biological functionality such as learning. The self-selecting memory cells include a chalcogenide material that can change a logic state (e.g., set or reset) of the chalcogenide material that is in an amorphous state responsive to a magnitude of voltage. A set state can be conductive (e.g., low-resistance to current flow) and a reset status can be less conductive (e.g., higher resistance to current flow). The change in state of the chalcogenide material between a set state and a reset state can change the threshold voltage value of the self-selecting memory cell in an analog fashion. The analog threshold voltage change of the chalcogenide material of the self-selecting memory cell can represent a synaptic weight in a neuromorphic memory system. Changes in synaptic weight can represent and/or be interpreted to represent learning and other biological functions.

In some embodiments, each row of memory cells 105 is connected to a first signal line 110-1, 110-2, or 110-N (e.g., an access line, sometimes referred to as a word line), and each column of memory cells 105 is connected to a second signal line 115-1, 115-2, or 115-S (e.g., a sense line, sometimes referred to as a bit line). Both access lines 110 and sense lines 115 may also be generically referred to as signal lines. Access lines 110 and sense lines 115 may be substantially perpendicular to one another and may support an array of memory cells. As used herein, the term "substantially" means that the modified characteristic (e.g., a verb or adjective modified by the term substantially) need not be absolute but is close enough so as to achieve the advantages of the characteristic. Although not illustrated in FIG. 1 as to not obscure examples of the disclosure, memory array 101 may include a substrate (further described herein in connection with FIG. 2).

In general, one memory cell 105 may be located at the intersection of two signal lines such as an access line 110 and a sense line 115. For example, memory cell 105 is located at the intersection of access line 110-1 and sense line 115-S. This intersection may be referred to as the address of the memory cell 105. A target memory cell 105 may be a memory cell 105 located at the intersection of an energized (e.g., activated) access line 110 and an energized (e.g., activated) sense line 115; that is, an access line 110 and a sense line 115 may both be energized in order to read or write a memory cell 105 at their intersection. Other memory cells 105 that are in electronic communication with (e.g., connected to) the same access line 110 or sense line 115 may be referred to as untargeted memory cells 105.

In some cases, an electrode may couple a memory cell 105 to an access line 110 or a sense line 115. As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of the memory array 101 of the memory device 100. Thus, the term electrode may refer in some cases to an access line, such as an access line 110 or a sense line such as sense line 115, as well as in some cases to an additional conductive element employed as an electrical contact between an access line and a memory cell 105.

In some embodiments, a memory cell 105 may comprise a chalcogenide material positioned between a first electrode and a second electrode. The first electrode may couple the chalcogenide material to an access line 110, and the second electrode couple the chalcogenide material to a sense line 115. The first electrode and the second electrode may be the same material (e.g., carbon) or different material. In other embodiments, a memory cell 105 may be coupled directly with one or more access lines, and electrodes other than the access lines may be omitted.

Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, Ge—Sb—Te—Pd, Ge—Sb—Te—Co, Sb—Te—Bi—Se, Ge—Sb—Se—Te, Ge—Sn—Sb—Te, Ge—Te—Sn—Ni, Ge—Te—Sn—Pd, or Ge— Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals (e.g., transition metals, alkaline earth metals), and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

Operations such as reading, and writing may be performed on memory cells 105 by activating or selecting access line 110 and sense line 115. Activating or selecting an access line 110 or a sense line 115 may include applying a voltage to the respective line. Access lines 110 and sense lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a cell (e.g., a resistive component in a CBRAM cell, a capacitive component in a FeRAM cell) may be electrically isolated from the sense line by a selection component. The access line 110 may be connected to and may control the selection component. For example, the selection component may be a transistor and the access line 110 may be connected to the gate of the transistor.

As mentioned, the selection component may be a variable resistance component of a variable resistance memory cell, which may comprise chalcogenide material. Specifically, the variable resistance memory cell can be a self-selecting memory cell, comprising a single material (e.g., the chalcogenide material) which can serve as both a select element and a storage element for the memory cell. Activating the access line 110 may result in an electrical connection or closed circuit between the logic storing device of the memory cell 105 and its corresponding sense line 115. The sense line may then be accessed to either read or write the memory cell 105. Upon selecting a memory cell 105, the resulting signal may be used to determine the stored logic state. In some cases, a first logic state may correspond to no current or a negligibly small current through the memory cell 105, whereas a second logic state may correspond to a finite current. In some cases, a memory cell 105 may include a self-selecting memory cell having two terminals and a separate selection component may be omitted. As such, one terminal of the self-selecting memory cell may be electrically connected to an access line 110 and the other terminal of the self-selecting memory cell may be electrically connected to a sense line 115.

Accessing memory cells 105 may be controlled through a row decoder 120 and a column decoder 130. For example, a row decoder 120 may receive a row address from the memory controller 140 and activate the appropriate access line 110 based on the received row address. Similarly, a column decoder 130 may receive a column address from the memory controller 140 and activate the appropriate sense line 115. For example, memory array 101 may include multiple access lines 110-1, 110-2, and 110-N and multiple sense lines 115-1, 115-2, and 115-S, where S and N depend on the array size. Thus, by activating an access line 110 and a sense line 115 (e.g., 110-1 and sense line 115-S), the memory cell 105 at the intersection may be accessed.

Upon accessing, a memory cell 105 may be read, or sensed, by sense component 125 to determine the programmed state of the memory cell 105. For example, a voltage may be applied to a memory cell 105 (using the corresponding access line 110 and sense line 115) and the presence of a resulting current through the memory cell 105 may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

The memory cell 105 (e.g., a variable resistance memory cell and/or a self-selecting memory cell) may comprise a chalcogenide material. The chalcogenide material of the memory cell may remain in an amorphous state during the access operation. In some cases, operating the memory cell may include applying various shapes of programming pulses to the memory cell to determine a particular threshold voltage of the memory cell that is, a threshold voltage of a memory cell may be modified by changing a shape of a programming pulse.

A particular threshold voltage of the memory cell 105 (e.g., a variable resistance memory cell and/or a self-selecting memory cell) may be determined by applying various shapes of read pulses to the memory cell. For example, when an applied voltage of a read pulse exceeds the particular threshold voltage of the memory cell, a finite amount of current may flow through the memory cell. Similarly, when the applied voltage of a read pulse is less than the particular threshold voltage of the memory cell, no appreciable amount of current may flow through the memory cell.

In some examples, described herein, in which the memory cell is a variable resistance memory cell (e.g., a self-selecting memory cell), applying read pulses that are less than the threshold voltage of the memory cell (e.g., a sub-threshold voltage) can change the threshold voltage of the memory cell 105 in an analog fashion. In other words, an initial threshold voltage of a variable resistance memory cell may change incrementally (e.g., in an analog fashion), responsive to having been pulsed below the initial threshold voltage (pulsed with a sub-threshold voltage). This change in threshold voltage can be responsive to the chalcogenide material of the variable resistance memory cell being altered.

In some embodiments, sense component 125 may read information stored in a selected memory cell 105 by detecting the current flow or lack thereof through the memory cell 105. In this manner, the memory cell 105 (e.g., variable resistance memory cell and/or a self-selecting memory cell) may store one bit of data based on threshold voltage levels (e.g., two threshold voltage levels) associated with the chalcogenide material, with the threshold voltage levels at which current flows through the memory cell 105 indicative of a logic state stored by the memory cell 105. In some cases, the memory cell 105 may exhibit a certain number of different threshold voltage levels (e.g., three or more threshold voltage levels), thereby storing more than one bit of data.

Sense component 125 may include various transistors or amplifiers in order to detect and amplify a difference in the signals associated with a sensed memory cell 105, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. An ordinary person skilled in the art would appreciate that sense component 125 may be associated either with decoder or row decoder without losing its functional purposes.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

A memory cell 105 may be set or written by similarly activating the relevant access line 110 and sense line 115, and at least one logic value may be stored in the memory cell 105. Column decoder 130 or row decoder 120 may accept data, for example input/output 135, to be written to the memory cells 105.

In some memory architectures, accessing the memory cell 105 may degrade or destroy the logic state and re-write or refresh operations may be performed to return the original logic state to memory cell 105. In DRAM, for example, the capacitor may be partially or completely discharged during a sense operation, corrupting the logic state, so the logic state may be re-written after a sense operation. Additionally, in some memory architectures, activating an access line 110 may result in the discharge of all memory cells in the row (e.g., coupled with the access line 110); thus, several or all memory cells 105 in the row may need to be re-written. But in non-volatile memory, such as variable resistance memory cells, self-selecting memory cells, and/or PCM memory, accessing the memory cell 105 may not destroy the logic state and, thus, the memory cell 105 may not require re-writing after accessing.

The memory controller 140 (e.g., a neural memory unit controller) may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired access line 110 and sense line 115. Memory controller 140 may also generate and control various voltages or currents used during the operation of memory device 100. In general, the amplitude, shape, polarity, and/or duration of an applied voltage or current discussed herein may be adjusted or varied and may be different for the various operations discussed in operating the memory device 100. Furthermore, one, multiple, or all memory cells 105 within memory array 101 may be accessed simultaneously; for example, multiple or all cells of memory array 101 may be accessed simultaneously during a reset operation in which all memory cells 105, or a group of memory cells 105, are set to a single logic state.

Various memory cells 105 of the memory device 100 may be grouped into memory units that are configured to store an analog value (e.g., a neural memory unit). The memory controller 140 may be coupled to the neural memory unit and referred to as a neural memory unit controller. The neural memory units may be configured to mimic neuro-biological architectures. The neural memory units may leverage properties of chalcogenide material within a memory cell to change the properties of the chalcogenide material. The changed properties of the chalcogenide material may alter the threshold voltage of the memory cell, this operation may be referred to as the memory cell 'storing' an analog value, as one example value. The analog value of a neural memory unit and/or multiple analog values of memory cells of a neural memory unit may be interpreted as a result of learning in a neural memory unit. An external host and/or a portion or the entire memory device 100 can generate and/or receive a learning algorithm. The learning algorithm is an algorithm that can be used in machine learning to help the neural memory unit imitate (e.g., mimic, emulate, etc.) neuro-biological architectures.

A learning algorithm can include variables of a learning event. A learning event can be a quantity of pulses of voltage values, a magnitude of voltage values (e.g., above or sub-threshold voltages), and/or a length of time a pulse is applied to be applied to memory cells (e.g., variable resistance memory cells) of a neural memory unit. A neural memory unit controller (e.g., the memory controller 140) can apply the learning algorithm to the array to attempt to elicit a learning event from the variable resistance memory cells of the neural memory unit.

As mentioned, a neural memory unit controller (e.g., memory controller 140) can be configured to apply a learning algorithm including learning events. For example, the neural memory unit controller can apply a quantity of sub-threshold voltage pulses to alter a single chalcogenide material of a self-selecting memory cell (e.g., memory cell 105) that is in an amorphous condition associated with a reset status to a condition associated with a set status. In other words, the chalcogenide material of the self-selecting memory cell can move between two electrical states responsive to a sub-threshold voltage pulse.

The neural memory unit controller (e.g., memory controller 140) can apply an iteration of a learning algorithm by applying sub-threshold voltage pulses to the variable resistance memory cells. The threshold voltage of the cells may change in an analog fashion responsive to the sub-threshold voltage pulses applied to the variable resistance memory cell. Each of the sub-threshold voltage pulses can change the synaptic weight (e.g., increase or decrease) of the variable resistance memory cell. The increase and/or decrease in synaptic weight can indicate whether learning has occurred in a neural memory unit. The neural memory unit controller can monitor the neural memory unit to determine when additional sub threshold pulses can be applied based on the synaptic weights. For example, the neural memory unit controller can refrain from applying an additional sub-threshold voltage pulse in response to the learning algorithm indicating that additional learning has not occurred (e.g., the threshold voltage did not change or increase).

In some embodiments, the neural memory unit controller can change the sub-threshold voltage pulses responsive to a degree of learning. For example, the neural memory unit controller can apply an additional sub-threshold voltage pulse as a relatively longer pulse to the variable resistance memory cell when an indication of relatively strong learning occurred (e.g., a decrease in the threshold voltage of the variable resistance memory cell of the array). Separately or concurrently, the neural memory unit controller can increase (or decrease) the quantity of sub-threshold voltage pulses responsive to the degree of learning occurring. The neural memory unit can be configured to monitor the degree of learning (e.g., the changing synaptic weights of the variable resistance memory cells of the array) and adjust variables (e.g., learning events) of a learning algorithm.

Figure 2:
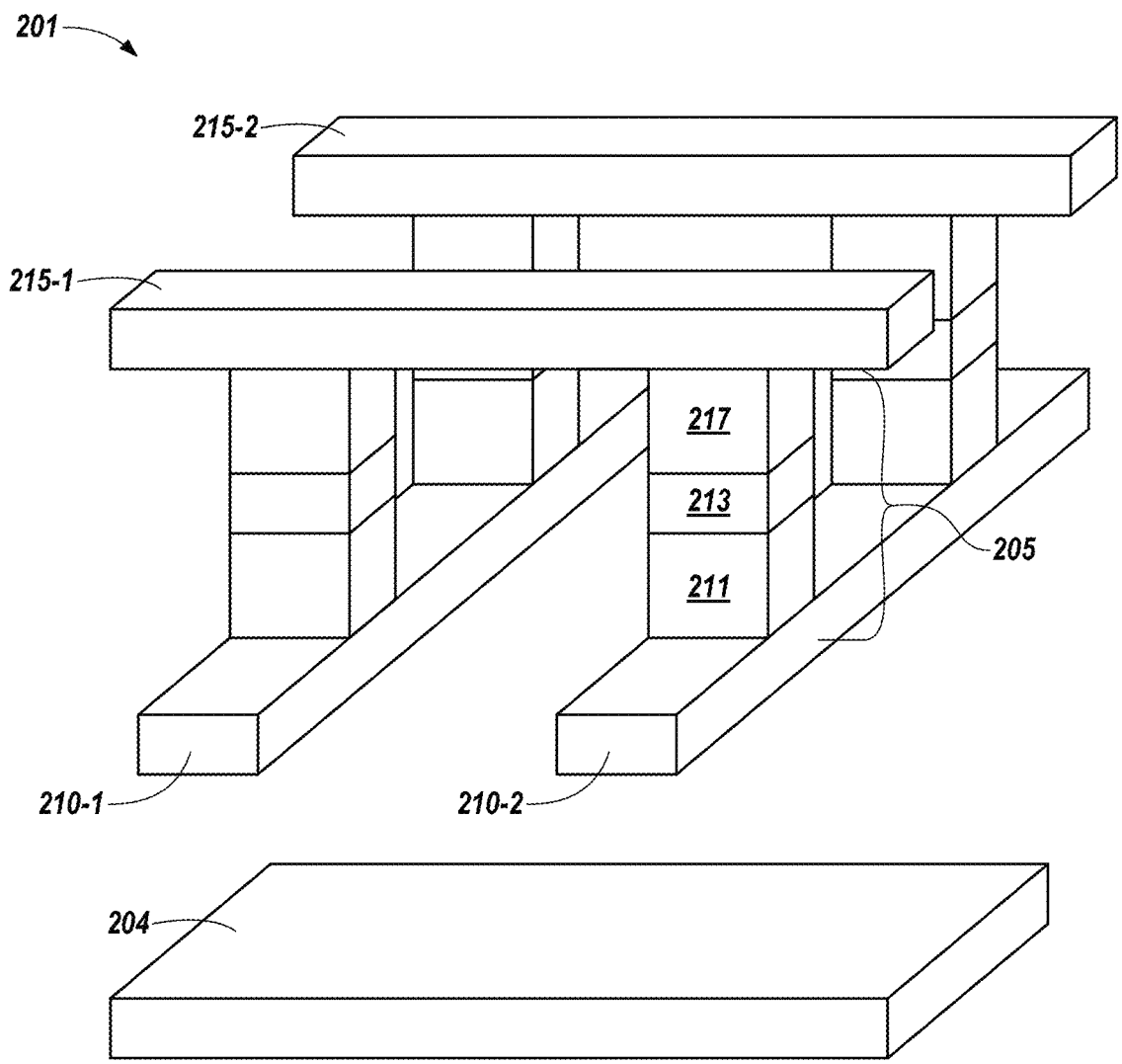
FIG. 2 illustrates an example of a memory array that supports neural network memory accordance with embodiments of the present disclosure.

FIG. 2 illustrates an example of a memory array 201 that supports neural network memory in accordance with embodiments of the present disclosure. Memory array 201 may be an example of portions of memory array 101 described with reference to FIG. 1. Memory array 201 may include memory cells 205 that are positioned above a substrate 204. Memory array 201 may also include access lines 210-1 and 210-2, and sense lines 215-1 and 215-2, which may be examples of access lines 110 and sense lines 115, as described with reference to FIG. 1. As in the illustrative example depicted in FIG. 2, memory cell 205 may be a self-selecting memory cell. Although some elements included in FIG. 2 are labeled with a numeric indicator, other corresponding elements are not labeled, though they are the same or would be understood to be similar, in an effort to increase the visibility and clarity of the depicted features.

In some cases, the memory cell 205 can be a self-selecting memory cell and can include a first electrode 211, a chalcogenide material 213, and a second electrode 217. In some embodiments, signal lines (e.g., access line 110 and sense line 115 of FIG. 1) may include an electrode layer (e.g., a conformal layer), in lieu of electrodes 211 or 217 and thus may comprise multi-layered access lines. In such embodiments, the electrode layer of the signal lines may interface with a memory material (e.g., chalcogenide material 213). In some embodiments, signal lines (e.g., access line 110, sense line 115) may directly interface with a memory material (e.g., chalcogenide material 213) without an electrode layer or an electrode in-between.

The architecture of memory array 201 may in some cases be referred to as an example of a cross-point architecture, as a memory cell 205 may be formed at a topological cross-point between an access line 210 and a sense line 215 as illustrated in FIG. 2. Such a cross-point architecture may offer relatively high-density data storage with lower production costs compared to some other memory architectures. For example, a memory array with a cross-point architecture may have memory cells with a reduced area and, resultantly, may support an increased memory cell density compared to some other architectures.

For example, a cross-point architecture may have a $4F^2$ memory cell area, where F is the smallest feature size (e.g., a minimum feature size), compared to other architectures with a $6F^2$ memory cell area, such as those with a three-terminal selection component. For example, a DRAM memory array, may use a transistor, which is a three-terminal device, as the selection component for each memory cell, and thus a DRAM memory array comprising a given number of memory cells may have a larger memory cell area compared to a memory array with a cross-point architecture comprising the same number of memory cells. While the example of FIG. 2 shows 1 level of a memory array (e.g., a memory deck), other configurations may include any number of decks. In some embodiments, one or more of the memory decks may include self-selecting memory cells that include chalcogenide material 213.

Memory cells e.g., memory cell 205, may be incorporated as part of memory units that may be configured to store values, which may in some cases be or include analog values. In some memory devices, applying an electronic pulse to a chalcogenide material 213 may cause the chalcogenide material 213 to be affected, which may in some cases include changing physical form. The physical forms for some chalcogenide materials 213 include an amorphous state and a crystalline state. The resistance of these physical forms is different, thereby allowing the chalcogenide material 213 to maintain a physical state which may be referred to as storing a logic (e.g., sense a logic and/or an analog value). In some embodiments of memory devices, applying an electronic pulse to a chalcogenide material 213 may not change a phase of the chalcogenide material 213 and the chalcogenide material 213 can remain amorphous. For example, set and reset states may be obtained by applying pulses of different (e.g., opposite) polarity, in some embodiments moreover, the threshold voltage can be modified or tuned by applying voltage pulses of appropriate amplitude and/or polarity.

Figure 3:
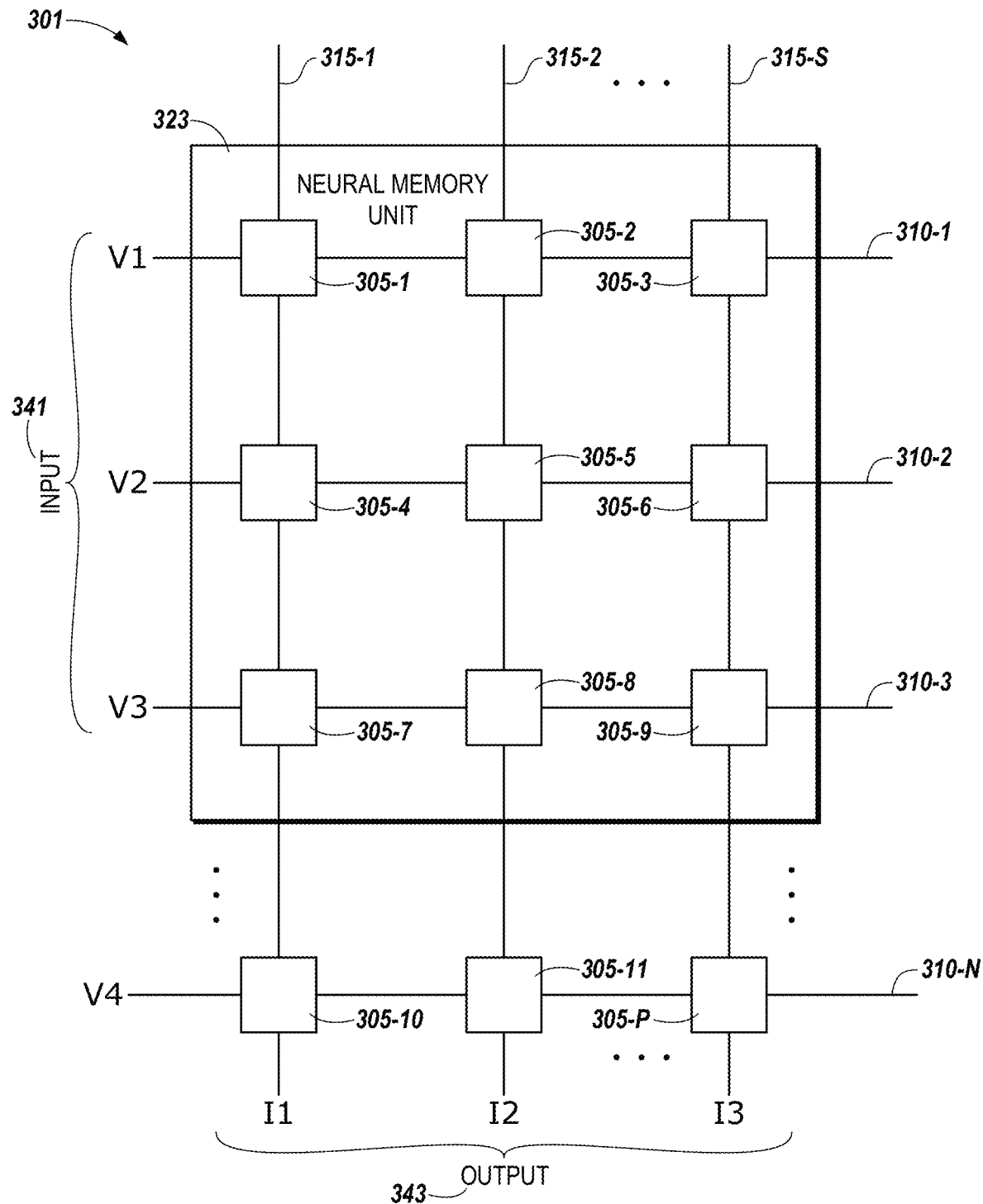
FIG. 3 illustrates an example of a memory array that supports neural network memory in accordance with embodiments of the present disclosure.

FIG. 3 illustrates an example of a memory array 301 that supports neural network memory in accordance with embodiments of the present disclosure. The memory array 301 may be similar to the example memory arrays 101 and 201 of FIGS. 1 and 2. The memory array 301 may include a neural memory unit 323 which can include a portion or all of the variable resistance memory cells 305 in the array 301. The memory array 301 may include multiple variable resistance memory cells 305-1, 305-2, 305-3, 305-4, 305-5, 305-6, 305-7, 305-8, 305-9, 305-10, 305-11, and 305-P (may be collectively referred to as the variable resistance memory cells 305). The memory array 301 may include a neural memory unit 323 which can include a portion or all of the variable resistance memory cells 305 in the array 301. The variable resistance memory cells 305 of the neural memory unit 323 may be coupled to a plurality of sense lines 315-1, 315-2, 315-S (may be collectively referred to as sense lines 315) and a plurality of access lines 310-1, 310-2, 310-3, 310-N (may be collectively referred to as access lines 310).

In some examples, a portion of the variable resistance memory cells of the memory array 301 may not be included in the neural memory unit 323. In the example array 301, the neural memory unit 323 includes variable resistance memory cells 305-1, 305-2, 305-3, 305-4, 305-5, 305-6, 305-7, 305-8, and 305-9 and the variable resistance memory cells 305-10, 305-11, and 305-P may be excluded from the neural memory unit 323. Thus, variable resistance memory cells 305 coupled to access line 310-N may be included in the memory array 301 but not necessarily be a part of the neural memory unit 323. In such examples, the variable resistance memory cells may be excluded from the total analog value stored by the neural memory unit 323.

A neural memory unit controller (e.g., memory controller 140 of FIG. 1) may select a neural memory unit 323 for a read operation. In some cases, the neural memory unit controller may select one or more variable resistance memory cells 305 of the neural memory unit 323 for a read operation. The neural memory unit controller may identify and/or select one or more sense lines 315 and/or access lines 310 associated with the neural memory unit 323.

The neural memory unit controller may provide an input 341 to the variable resistance memory cells 305 of the neural memory unit 323. The input 341 may comprise a plurality of voltage values (e.g., sub-threshold voltage values) applied to a plurality of access lines 310 (e.g., V1, V2, V3). The neural memory unit controller may bias the access lines 310 to one or more voltage values (e.g., a read voltage value) included in the input 341. In some cases, the access lines 310 are all biased to the same read voltage. In some cases, the neural memory unit controller may bias one or more access lines to a different voltage than the other access lines.

The neural memory unit controller may also bias an unselected access line 310-N (e.g., an access lines not included in the neural memory unit 323) to a read voltage value. In some cases, the read voltage values applied to the one or more unselected access lines 310-N are the same as the voltage values applied to the selected access lines 310-1, 310-2, 310-3. In some cases, the read voltage values applied to the unselected access lines 310-N are different than a voltage value applied to one of the selected access lines 310-1, 310-2, 310-3.

The neural memory unit controller may detect an output 343 that includes one or more signals generated on one or more sense lines 315 coupled with the neural memory unit 323. The output 343 on the sense lines 315 may be generated based on applying the input 341 to the access lines 310 coupled with the neural memory unit 323. The signals of the output 343 may comprise current signals (e.g., I1, I2, I3).

An individual signal or an individual threshold voltage (e.g., threshold weigh and/or synaptic weight) may be detected on each sense line 315 coupled with the neural memory unit 323. Each signal or weight may have different variable resistance memory cells contributing to the signal. For example, the variable resistance memory cells 305-1, 305-4, and 305-7 may contribute to the signal on the first sense line 315-1. The variable resistance memory cells 305-2, 305-5, and 305-8, may contribute to the signal on the second sense line 315-2. The variable resistance memory cells 305-3, 305-6, and 305-9 may contribute to the signal on the third sense line 315-S.

The neural memory unit controller may determine the analog value stored in the neural memory unit 323 based on the detecting the signals generated on the sense lines 315 coupled with the neural memory unit 323. The neural memory unit controller may combine signals and/or the threshold voltage (e.g., synaptic weights) on each sense line 315 to generate a total weight (may be referred to as a total analog value). The analog value may be proportional to and/or based on the total weight. The neural memory unit controller may sum the signals of the sense lines 315 to generate the total weight. In some cases, the neural memory unit controller may generate a product by applying a weight matrix to an input vector of voltages that represent the one or more voltages on one or more access lines (e.g. V1, V2, V3). For example, the neural memory unit controller may apply a vector by matrix multiplication operation, where the vector is the input 341 (V1, V2, and V3), and the matrix is the threshold voltage of the respective variable resistance memory cells 305 included in the neural memory unit 323.

For example, the neural memory unit controller can be configured to apply a respective sub-threshold voltage pulse via each of the access lines 310 to change a threshold voltage of a respective variable resistance memory cell 305 coupled to each of the access lines 310 and to a particular sense line 315-1 in an analog fashion toward a voltage associated with a set state to effectuate synaptic weight changes. Each of the variable resistance memory cells 305-1, 305-4, and 305-7 can receive the sub-threshold voltage in this instance. The neural memory unit controller can be further configured to, apply another respective sub-threshold voltage pulse via each of the plurality of access lines 310 to change a threshold voltage of a respective variable resistance memory cell 305 coupled to each access lines 310 and to a different sense line 315-2 in an analog fashion toward a voltage associated with a set state to effectuate synaptic weight changes. In this instance, each of the variable resistance memory cells 305-2, 305-5, and 305-8 can receive the sub-threshold voltage. This example method can continue for any number of sense lines 315 to effectuate synaptic weight changes of the variable resistance memory cells 305. The neural memory unit controller can be configured to read a voltage from each of the sense lines 315-1, and 315-2 to determine a total analog value of the memory array 301 (e.g., a total analog value of the neural memory unit 323) which may be the output 343.

The neural memory unit controller can be configured to apply subsequent voltage pulses as input 341 based on the detected total analog value of the sense lines 315-1 and 315-2. In some embodiments, the neural memory unit controller can be configured to apply a vector (e.g., the input 341-V1, V2, and V3) responsive to a learning algorithm. The learning algorithm and/or the neural memory unit controller can be configured to perform matrix multiplication of vectors (e.g., input 341) each comprised of the respective threshold voltage of each variable resistance memory cell in each of the plurality of sense lines 215-1, and 215-2, and/or 215-S.

Figure 4:
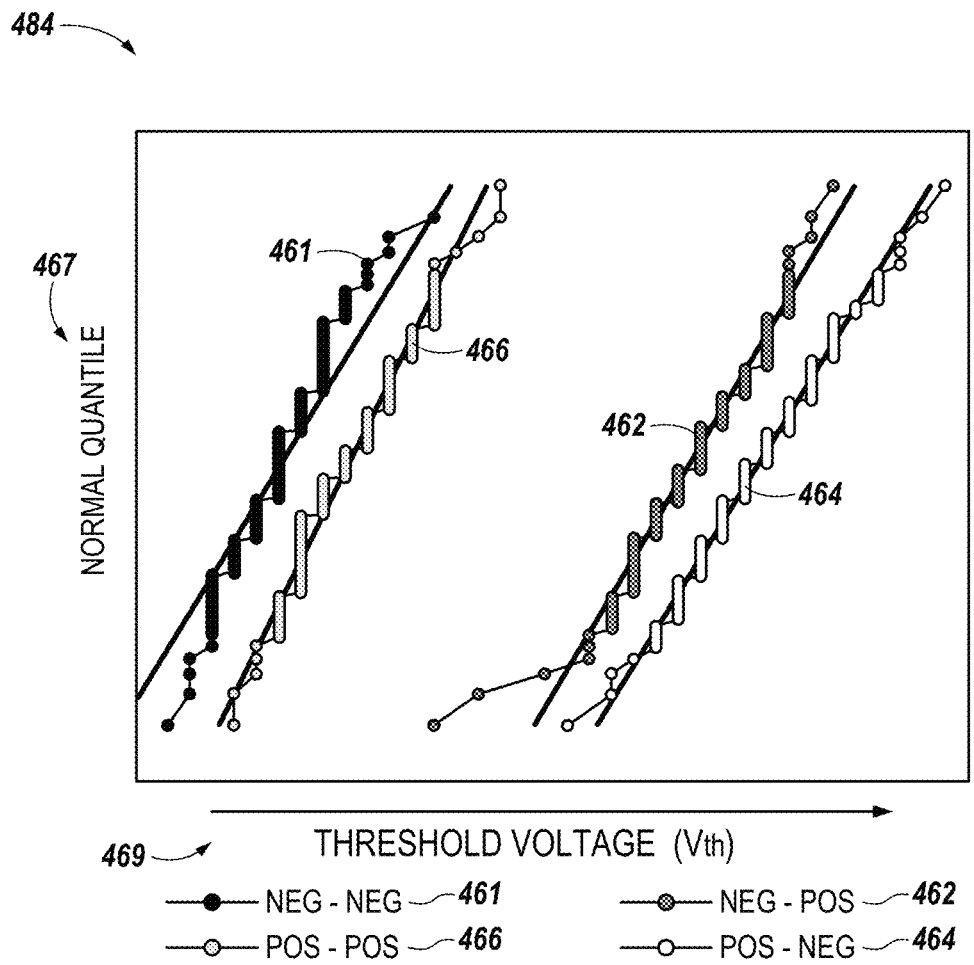
FIG. 4 illustrates an example graph of threshold voltage distributions of memory cells in accordance with an embodiment of the present disclosure.

FIG. 4 illustrates an example graph of threshold voltage distributions of neural network memory in accordance with an embodiment of the present disclosure. The example graph 484 illustrates an x-axis of threshold voltage (Vth) 469 of variable resistance memory cells (e.g., self-selecting memory cells) where the Vth increases from the left side of the page to the right side of the page. Graph 484 illustrates y-axis 467 representing a statistical normal quantile of bit (e.g., standard deviation in gaussian distribution). The graph 484 illustrates arrays of variable resistance memory cells during different programming and read combinations. The legend below the x-axis includes respective line notation for different combinations of polarities of programming pulses and read values. For example, a notation for negative programming with a negative read 461, a notation for negative programming and a positive read 462, a notation for positive programming and a negative read 464, and a notation for a positive programming with a positive read 466.

Each variable resistance memory cell of a memory array (e.g., a neural memory unit) can be programmed to include a threshold voltage Vth 469. Each variable resistance memory cell can spread the Vth values within a range between a high Vth state (e.g., a reset pulse) and a low Vth state (e.g., a set pulse) when voltage is pulsed below the threshold voltage Vth 469. The programming pulse and/or other voltage pulses applied across the variable resistance memory cells (e.g., self-selecting memory cells) can be referred to herein as being of a polarity. Polarity refers to a bias in the voltages of write and read operations. A sense line and an access line (e.g., the sense lines 315 and access lines 310 of FIG. 3) can be biased at different voltages for write and read operations. For example, a programming pulse can be of a positive or negative polarity and can depend on read polarity. The behavior of the variable resistance memory cell may determine if the read pulse determined in response to the programming pulse has a positive or negative voltage value.

As described herein, self-selecting memory cells such as the variable resistance memory cells in the array can be configured by a neural memory unit controller to change a logic state by manipulating their respective chalcogenide material ire an amorphous state. This state change can increase or decrease the resistive value of the self-selecting memory cell which can be represented as a synaptic weight. Such variable resistance memory cells may include memory cells configured to store multiple levels and/or that may have wide sense windows. Such types of memory may be configured to perform training operations by pulse (e.g., spike) control. Such training operations may include spike-timing-dependent plasticity (STDP). STDP may be form of Hebbian learning that is induced by correlation between spikes transmitted between nodes (e.g., neurons). STDP may be an example of a process that adjusts the strength of connections between nodes (e.g., neurons). FIG. 4 illustrates a large analog value spread (e.g., wide sense window/a digital state with bit to bit variability) of Vth values in instances where the read value is negative (e.g., neg-neg 461 and pos-neg 464) compared to instances where the read value is positive (e.g., neg-pos 462 and pos-pos 466), which may have a narrower sense window and a smaller Vth spread.

Variable resistance memory cells can be used in neuromorphic applications where the array of variable resistance memory cells can be trained by external pulses to obtain certain analog Vth values. Current along signal lines (e.g., sense lines 315 and access lines 310 of FIG. 3) can represent the final output (e.g., output 343, a total analog value of a neural memory unit 323 of FIG. 3), depending on the input voltages (e.g., input 341 of FIG. 3). This may be obtained by using the analog voltage inputs in a matrix by a vector multiplication function.

Figure 5:
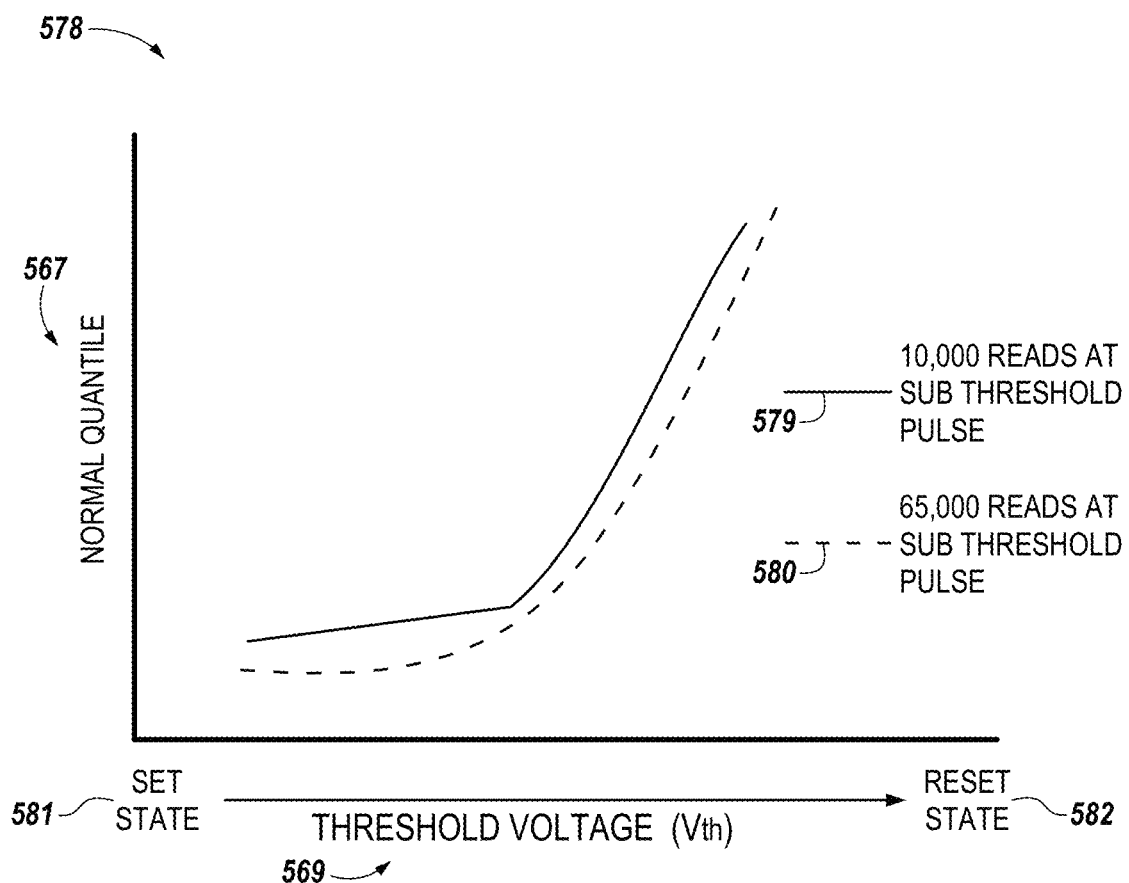
FIG. 5 illustrates an example graph of threshold voltage distributions of memory cells in accordance with an embodiment of the present disclosure.

FIG. 5 illustrates an example graph of threshold voltage distributions of neural network memory in accordance with an embodiment of the present disclosure. The example graph 578 illustrates an x-axis of threshold voltages (Vth) 569 of variable resistance memory cells (e.g., self-selecting memory cells) where the Vth increases from the left side of the page (a set state 581) to the right side of the page (a reset state 582). Graph 578 illustrates y-axis 567 representing a statistical normal quantile of bit (e.g., standard deviation in gaussian distribution).

The legend of the graph 578 illustrates a solid line 579 representing a memory array of variable resistance memory cells at 10,000 reads at a sub-threshold voltage pulse. The legend of the graph 578 illustrates a broken line 580 of variable resistance memory cells at 65,000 reads at sub-threshold voltage pulses. While quantities of pulses are recited here as examples, any number of pulses could be used.

The graph 578 illustrates threshold voltage (Vth) 569 which can be a range of analog values representing an incremental change in logic state of the chalcogenide material of a variable resistance memory cell (e.g., a self-selecting memory cell). As the variable resistance memory cell is pulsed (e.g., 10,000 or 65,000 reads) the chalcogenide material of the variable resistance memory cell can change from a reset state 582 corresponding to a higher Vth (e.g., low conductance, high resistance to current flow) toward a set state 581 corresponding to a lower Vth (e.g., high conductance, low resistance to current flow). The chalcogenide material of a self-selecting memory cell can be in an amorphous state and have different threshold voltage values while maintaining the amorphous state, based at least in part, on a number of sub-threshold pulses, a magnitude of sub-threshold pulses, and/or a duration of the sub-threshold pulses.

The variable resistance memory cells of 579 and/or 580 can change threshold voltages in an analog manner from a reset state 582 to a set state toward 581. Said differently, the threshold voltage 569 in a range of analog values between a voltage associated with a reset state 582 and the voltage associated with the set state 581 can change responsive to sub-threshold voltage pulses, where each of the range of analog values corresponds to a synaptic weight.

The quantity of pulses and/or the magnitude of sub-threshold voltage pulses can be associated with strong learning event and/or a weak learning event. In some embodiments, the learning events (e.g., the quantity of pulses and/or the magnitude of voltage pulses) can be set by a learning algorithm, where a weak learning event may be a relatively low quantity of pulses (e.g., less than 1000) and/or pulse that is not far enough below the Vth of the variable resistance memory cell. A strong learning event may be a relatively high quantity of pulses (e.g., greater than 1000) and/or a pulse that is a larger magnitude below the Vth of the variable resistance memory cell. Stronger learning events may correspond to a greater change in threshold voltages of the variable resistance memory cells.

FIG. 6 illustrates an example method 660 for neural network memory in accordance with embodiments of the present disclosure. The operations of method 660 may be implemented by a neural memory unit controller (e.g., the controller 140 of FIG. 1) or its components as described herein. For example, the operations of method 660 may be performed within a neural memory unit as described with reference to FIGS. 1-5. In some examples, a neural memory unit controller may execute a set of codes to control the functional elements of a memory device to perform the functions described below. Additionally, or alternatively, the neural memory unit controller may perform aspects of the functions described below using special-purpose hardware.

At block 692, method 660 includes applying, by a neural memory unit controller coupled to an array of variable resistance memory cells (e.g., the variable resistance memory cells 105 of FIG. 1), a weak sub-threshold voltage pulse to a variable resistance memory cell of the array (e.g., the array 301 of FIG. 3) in response to a first weak learning event.

The weak sub-threshold voltage pulse causes a weak change in a threshold voltage (e.g., Vth 569 of FIG. 5) of the variable resistance memory cell in an analog fashion toward a voltage associated with a set state (e.g., the set state 581 of FIG. 5) to effectuate a weak synaptic weight change. In this example, the weak sub-threshold voltage may be a voltage that is below the threshold voltage Vth of the variable resistance memory cell, but the difference in magnitude between the sub-voltage pulse and the Vth of the variable resistance memory cell not enough to change the Vth to a degree to represent learning.

At block 694, method 660 includes applying, by the neural memory unit controller coupled to the array of variable resistance memory cells, a strong sub-threshold voltage pulse to the variable resistance memory cell of the array. The strong sub-threshold voltage pulse may have a greater difference in magnitude between the voltage of the sub-threshold voltage pulse and the Vth of the variable resistance memory cell. Where the strong sub-threshold voltage pulse causes a strong change in the threshold voltage of the variable resistance memory cell in an analog fashion toward the voltage associated with the set state to effectuate a strong synaptic weight change. Said differently, the application of the strong sub-threshold voltage pulse can include the difference in magnitude of the second pulse being larger than the first. In other embodiments, in lieu of, or in addition to the strong sub-threshold pulse, the duration of the sub-threshold pulse can be manipulated to elicit a change in the Vth of the variable resistance memory cell. For example, the application of the strong sub-threshold voltage pulse can include the difference in duration of the second pulse being longer than the first.

FIG. 7 illustrates an example method 777 for neural network memory in accordance with embodiments of the present disclosure. The operations of method 777 may be implemented by a neural memory unit controller (e.g., the controller 140 of FIG. 1) or its components as described herein. For example, the operations of method 777 may be performed within a neural memory unit as described with reference to FIGS. 1-6. In some examples, a neural memory unit controller may execute a set of codes to control the functional elements of a memory device to perform the functions described below. Additionally, or alternatively, the neural memory unit controller may perform aspects of the functions described below using special-purpose hardware.

At 791, the method 777 includes applying, by a neural memory unit controller coupled to an array of variable resistance memory cells (e.g., the variable resistance memory cells 105 of FIG. 1), a first quantity of sub-threshold voltage pulses to a variable resistance memory cell of the array in response to a weak learning event. The first quantity of sub-threshold voltage pulses can cause a weak change in a threshold voltage Vth (e.g., Vth 569 of FIG. 5) of the variable resistance memory cell in an analog fashion toward a voltage associated with a set state (e.g., the set state 581 of FIG. 5) to effectuate a weak synaptic weight change.

The weak synaptic weight change can be an ineffective change in the voltage threshold Vth of the variable resistance memory cell. In this example, the learning algorithm may increase the quantity of pulses applied to the variable number resistance cell (e.g., may change the learning event).

At 793, the method 777 includes applying, by the neural memory unit controller coupled to the array of variable resistance memory cells, a second quantity of sub-threshold voltage pulses to the variable resistance memory cell of the array in response to a strong learning event where the second quantity is greater than the first quantity. For example, the neural network unit controller can increase the quantity of pulses from 1000 to 65000 to effectuate a change in Vth toward the set state. In this way, the second quantity of sub-threshold voltage pulses can cause a strong change in the threshold voltage of the variable resistance memory cell in an analog fashion toward the voltage associated with the set state to effectuate a strong synaptic weight change.

Using the example method 777, the neural memory unit controller can apply subsequent sub-threshold voltage pulses to the variable resistance memory cell in response to subsequent learning events until a sub-threshold voltage pulse causes the variable resistance memory cell to reach the set state (e.g., a crystalline, highly conductive, low resistance to current flow state).

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of variable resistance memory cells; and
   a neural memory unit controller coupled to the array of variable resistance memory cells and configured to:
      apply a sub-threshold voltage pulse to a variable resistance memory cell of the array to change a threshold voltage of the variable resistance memory cell in an analog fashion from a voltage associated with a reset state to effectuate a first synaptic weight change;
      wherein the sub-threshold voltage pulse comprises a voltage pulse in a polarity opposite a write polarity; and
      apply additional sub-threshold voltage pulses to the variable resistance memory cell to effectuate each subsequent synaptic weight change.

2. The apparatus of claim 1, wherein the variable resistance memory cell is a self-selecting memory cell comprising a single chalcogenide material to operate as a selection component and a storage component.

3. The apparatus of claim 2, wherein the neural memory unit controller being configured to apply the sub-threshold voltage pulse and the additional sub-threshold voltage pulses comprises the neural memory unit controller being configured to determine the single chalcogenide material is in an amorphous condition associated with a reset state.

4. The apparatus of claim 2, wherein the neural memory unit controller being configured to apply the sub-threshold voltage pulse and the additional sub-threshold voltage pulses comprises the neural memory unit controller being configured to alter the single chalcogenide material toward a condition associated with a set state.

5. The apparatus of claim 1, wherein the neural memory unit controller is further configured to operate the array of variable resistance memory cells as a neural network, wherein a threshold voltage of the variable resistance memory cell represents a synaptic weight; and
   wherein the additional sub-threshold voltage pulses each decreases a resistance of the variable resistance memory cell to represent a change in synaptic weight.

6. The apparatus of claim 1, wherein the neural memory unit controller is configured to apply one of the additional sub-threshold voltage pulses to the variable resistance memory cell in response to an iteration of a learning algorithm indicating that increased learning has occurred.

7. The apparatus of claim 6, wherein the neural memory unit controller is further configured not to apply one of the additional sub-threshold voltage pulses to the variable resistance memory cell in response to the iteration of the learning algorithm indicating that additional learning has not occurred.

8. The apparatus of claim 6, wherein the neural memory unit controller is configured to apply the one of the additional sub-threshold voltage pulses as a relatively longer pulse to the variable resistance memory cell in response to an iteration of a learning algorithm indicating that relatively strong increased learning has occurred.

9. The apparatus of claim 6, wherein the neural memory unit controller is configured to apply more than one of the additional sub-threshold voltage pulses to the variable resistance memory cell in response to an iteration of a learning algorithm indicating that relatively strong increased learning has occurred.

10. The apparatus of claim 1, wherein the neural memory unit controller being configured to apply additional sub-threshold voltage pulses to the variable resistance memory cell comprises the neural memory unit controller being configured to change the threshold voltage of the variable resistance memory cell within a range of analog voltage values.

11. An apparatus, comprising:
    a plurality of first signal lines;
    a plurality of second signal lines;
    an array of variable resistance memory cells; and
    a neural memory unit controller coupled to the plurality of first signal lines and the plurality of second signal lines, the neural memory unit controller configured to:
       apply a respective sub-threshold voltage pulse via each of the plurality of first signal lines to change a threshold voltage of a respective variable resistance memory cell coupled to each of the plurality of first signal lines and to a particular second signal line in an analog fashion toward a voltage associated with a set state to effectuate a synaptic weight change;
       wherein the respective sub-threshold voltage pulse comprises a voltage pulse in a polarity opposite a write polarity;

apply a respective sub-threshold voltage pulse via each of the plurality of first signal lines to change a threshold voltage of a respective variable resistance memory cell coupled to each of the plurality of first signal lines and to a different second signal line in an analog fashion toward a voltage associated with a set state to effectuate a synaptic weight change; and read a voltage or a current from each of the plurality of second signal lines to determine a total analog value of the array.

12. The apparatus of claim 11, wherein the neural memory unit controller is further configured to apply a subsequent respective sub-threshold voltage pulse via each of the plurality of first signal lines to change the threshold voltage of the respective variable resistance memory cell coupled to each of the plurality of first signal lines and to the particular second signal line in an analog fashion to effectuate a subsequent synaptic weight change based in part on the total analog value of the array.

13. The apparatus of claim 11, wherein the neural memory unit controller being configured to apply the respective sub-threshold voltage pulse via each of the first plurality of signal lines comprises the neural memory unit controller being configured to input a vector of data from a learning algorithm.

14. The apparatus of claim 13, wherein the neural memory unit controller being configured to read the voltage or the current from each of the plurality of second signal lines comprises the neural memory unit controller being configured to perform matrix multiplication of vectors each comprised of the respective threshold voltage of each variable resistance memory cell in each of the plurality of second signal lines.

15. A method, comprising:
applying, by a neural memory unit controller coupled to an array of variable resistance memory cells, a weak sub-threshold voltage pulse to a variable resistance memory cell of the array in response to a first weak learning event;
wherein the weak sub-threshold voltage pulse causes a weak change in a threshold voltage of the variable resistance memory cell in an analog fashion toward a voltage associated with a set state to effectuate a weak synaptic weight change;
applying, by the neural memory unit controller coupled to the array of variable resistance memory cells, a strong sub-threshold voltage pulse to the variable resistance memory cell of the array;
wherein the strong sub-threshold voltage pulse causes a strong change in the threshold voltage of the variable resistance memory cell in an analog fashion toward the voltage associated with the set state to effectuate a strong synaptic weight change; and
wherein applying the weak sub-threshold voltage pulse and wherein applying the strong sub-threshold voltage pulse comprises applying a respective voltage in a polarity opposite a write polarity.

16. The method of claim 15, wherein applying the weak sub-threshold voltage pulse comprises applying a first voltage pulse having a first magnitude; and wherein applying the strong sub-threshold voltage pulse comprises applying a second voltage pulse having a second magnitude greater than the first magnitude.

17. The method of claim 15, wherein applying the weak sub-threshold voltage pulse comprises applying a first voltage pulse having a first duration; and
wherein applying the strong sub-threshold voltage pulse comprises applying a second voltage pulse having a second duration longer than the first duration.

18. The method of claim 15, further comprising determining a total analog value of the array of variable resistance memory cells, wherein the total analog value represents an aggregation of a synaptic weight for each of the variable resistance memory cells of the array.

19. The method of claim 15, wherein applying the weak sub-threshold voltage pulse and wherein applying the strong sub-threshold voltage pulse comprises decreasing a resistance of a chalcogenide material of the variable resistance memory cell.

20. The method of claim 15, wherein the array of variable resistance memory cells comprise self-selecting memory cells, each comprising a single chalcogenide material to operate as a selection component and a storage component.

21. A method, comprising:
applying, by a neural memory unit controller coupled to an array of variable resistance memory cells, a first quantity of sub-threshold voltage pulses to a variable resistance memory cell of the array in response to a weak learning event;
wherein the first quantity of sub-threshold voltage pulses causes a weak change in a threshold voltage of the variable resistance memory cell in an analog fashion toward a voltage associated with a set state to effectuate a weak synaptic weight change;
wherein the first quantity of sub-threshold voltage pulses comprise voltage pulses in a polarity opposite a write polarity;
applying, by the neural memory unit controller coupled to the array of variable resistance memory cells, a second quantity of sub-threshold voltage pulses to the variable resistance memory cell of the array in response to a strong learning event; and
wherein the second quantity of sub-threshold voltage pulses causes a strong change in the threshold voltage of the variable resistance memory cell in an analog fashion toward the voltage associated with the set state to effectuate a strong synaptic weight change.

22. The method of claim 21, wherein the second quantity is greater than the first quantity.

23. The method of claim 21, further comprising applying subsequent sub-threshold voltage pulses to the variable resistance memory cell in response to subsequent learning events until a sub-threshold voltage pulse causes the variable resistance memory cell to reach the set state.

24. The method of claim 23, wherein the method includes changing the threshold voltage in a range of analog values between a voltage associated with a reset state and the voltage associated with the set state, each of the range of analog values corresponding to a synaptic weight.

* * * * *